(12) United States Patent
Silvestri

(10) Patent No.: US 8,245,176 B2
(45) Date of Patent: *Aug. 14, 2012

(54) INTEGRATED CIRCUIT APPARATUS, SYSTEMS, AND METHODS

(75) Inventor: Paul A. Silvestri, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/208,986

(22) Filed: Aug. 12, 2011

(65) Prior Publication Data

US 2011/0298122 A1    Dec. 8, 2011

Related U.S. Application Data

(63) Continuation of application No. 12/197,869, filed on Aug. 25, 2008, now Pat. No. 8,001,513.

(51) Int. Cl.
  *G06F 17/50* (2006.01)
(52) U.S. Cl. ......... 716/126; 716/118; 716/119; 716/130
(58) Field of Classification Search .................. 716/118, 716/119, 126, 130
  See application file for complete search history.

(56) References Cited

U.S. PATENT DOCUMENTS

| | | | |
|---|---|---|---|
| 4,970,454 A | 11/1990 | Stambaugh et al. | |
| 5,454,160 A | 10/1995 | Nickel | |
| 5,910,010 A | 6/1999 | Nishizawa et al. | |
| 6,066,561 A | 5/2000 | Kumar et al. | |
| 6,128,201 A | 10/2000 | Brown et al. | |
| 6,173,435 B1 | 1/2001 | Dupenloup | |
| 6,205,572 B1 | 3/2001 | Dupenloup | |
| 6,686,656 B1 | 2/2004 | Koh et al. | |
| 6,686,768 B2 | 2/2004 | Comer | |
| 8,001,513 B2 | 8/2011 | Silvestri | |
| 8,006,216 B1 * | 8/2011 | Chen et al. | 716/126 |
| 2007/0050743 A1 * | 3/2007 | Batra | 716/10 |
| 2010/0047966 A1 | 2/2010 | Silvestri | |

* cited by examiner

*Primary Examiner* — Sun Lin
(74) *Attorney, Agent, or Firm* — Schwegman, Lundberg & Woessner, P.A.

(57) ABSTRACT

High density circuit modules are formed by stacking integrated circuit (IC) chips one above another. Unused input/output (I/O) locations on some of the chips can be used to connect other I/O locations, resulting in decreased impedance between the chips. Additional apparatus, systems, and methods are disclosed.

21 Claims, 4 Drawing Sheets

INTEGRATED CIRCUIT APPARATUS, SYSTEMS, AND METHODS

RELATED APPLICATION

This application is a continuation application of U.S. application Ser. No. 12/197,869, filed 25 Aug. 2008, now issued as U.S. Pat. No. 8,001,513, which application is incorporated by reference herein in its entirety.

BACKGROUND

The semiconductor device industry has a market driven need to reduce the time required for signals to travel between integrated circuits (ICs), such as the high number of relatively low cost memory chips used in virtually every electronic device. One method known to reduce signal travel time is to reduce the physical distance between closely related IC chips by attaching them together in a vertical stack. This reduces the distance the signals travel as well as reducing electrical resistance, inductance and capacitance, resulting in faster systems using IC technology.

There is an industry wide issue in stacking ICs such as memory chips and logic chips, and interconnecting the ICs to reduce the capacitance for fast inter-chip communication. Current methods of connecting similar Input/Output (I/O) pads on stacked chips, such as using wire bonds, share all of the I/O pads for all of the chips in the vertical stack. This may increase the capacitance between the interconnected I/O pads.

DETAILED DESCRIPTION

Figure 1:
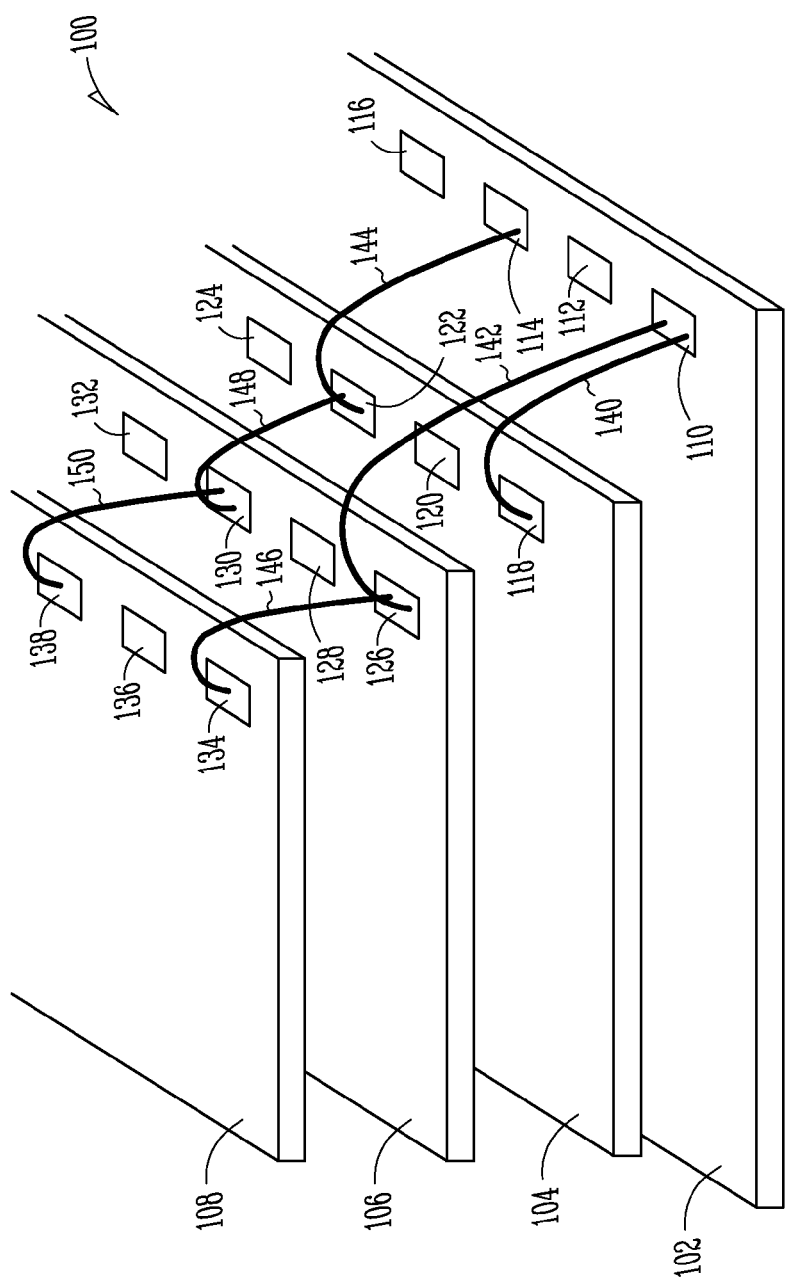
FIG. 1 illustrates a prior art stack of integrated circuit (IC) chips.

The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized and structural, logical, and electrical changes may be made without departing from the scope of the present invention. The various embodiments are not necessarily mutually exclusive, as some embodiments can be combined with one or more other embodiments to form new embodiments.

The term "substrate" as used in the following description may include any structure having an exposed surface with which to form an IC structure. The term "substrate" is understood to include semiconductor wafers and is also used to refer to semiconductor structures during processing and may include other layers that have been fabricated thereupon. A "wafer" and a "substrate" each include doped and undoped semiconductors, epitaxial semiconductor layers supported by a base semiconductor or insulator, as well as other semiconductor structures well known to one skilled in the art. The term "chip" is used to refer to IC devices, including logic devices, microprocessors, and various types of memory devices.

The term "conductor" is understood to generally include n-type and p-type semiconductors and doped regions in semiconductors. Conductors may conduct electrical energy including ground potential, various voltage reference levels, and information signals, and may be referred to as wires, lines, cables, buses, planes or traces, depending upon the physical configuration and use of the conductor. The term "insulator" or "dielectric" is defined to include any material that is less electrically conductive than the materials referred to as conductors or as semiconductors.

The term "crystalline" is understood to not be limited to large single crystals having a specified crystallographic orientation, but may include polycrystalline materials having a large number of moderately sized crystals having various crystallographic orientations. The term "amorphous" is not limited to a solid material having a completely disordered or glassy structure, but may include materials having some crystalline order over short distances—on the order of ten atomic separations or less.

The term "horizontal" is defined as a plane parallel to the conventional plane or surface of a wafer or substrate, regardless of the orientation of the wafer or substrate. The term "vertical" refers to a direction perpendicular to the horizontal as defined above. Prepositions, such as "on", "side" "higher", "lower", "over" and "under" are defined with respect to the conventional plane or surface being on the top surface of the wafer or substrate, regardless of the orientation of the wafer or substrate. The following detailed description is, therefore, not to be taken in a limiting sense, and the scope of the present invention is defined only by the appended claims, along with the full scope of equivalents to which such claims are entitled.

FIG. 1 illustrates a prior art stack 100 of integrated circuit (IC) chips. Memory chips such as dynamic random access memory (DRAM), static random access memory (SRAM), content addressable memory (CAM), and flash memory, may be stacked together with similar input output (I/O) pads having a similar function located directly above one another. It may also be convenient to directly connect similar function I/O pads to one another in a series connection of inter-connections, such as wire bonds. The stack 100 of ICs may include a number of memory chips 104, 106 and 108, which may be located over a logic chip 102. The illustrated example includes three memory chips, but there is no specific limit to the number of memory chips, nor is there any limitation on the types of chips, which may include various types of memory chips, logic chips, microprocessor chips, or other types of chips.

The logic chip 102 has I/O pads 110, 112, 114, and 116 shown located on one side of the chip. Any of the four sides of a chip may have I/O pads such as those shown in FIG. 1 and the I/O pads may be formed of two or more connected metallic pads to allow for additional external connections, such as the shown wire bonds 140, 142, 144 146, 148 and 150. Other connection methods may be used including gold bumps, solder bumps, beam leads, and other well known methods. In the example IC stack 100, only I/O pads 110 and 114 are bonded and in use for interconnection with either the external world or the other chips 104, 106 and 108 in the stack 100. I/O pads 112 and 116 are not used in the particular design shown in the figure, and thus the space for the unused I/O pads and the space for the connected power device is wasted in this illustrative design.

In this arrangement the chip 102 provides power from I/O pad 110 to drive a signal through wirebond 140 to chip 104, through wirebond 142 to I/O pad 126 on chip 106, and through wirebond 146 to I/O pad 134 on chip 108. The number and length of the wire bonds that the I/O pad 110 drives to transmit signals to the three shown chips 104, 106 and 108 may require a larger drive device connected to I/O pad 110 than is usual, and thus may require a specially designed chip rather than an off-the-shelf device with a normal drive device circuit.

The I/O pad 114 on chip 102 is shown with another prior art stacked IC interconnection method where the I/O pad 114 drives a wire bond 144 to drive a signal to I/O pad 122 on chip 104. The wire bond 148 connecting I/O pad 122 on chip 104 with I/O pad 130 on chip 106 has the same signal provided in series from chip 102, and that signal is also driven by the I/O pad 114 on chip 102. I/O pad 130 on chip 106 is also connected by wire bond 150 to I/O pad 138 on chip 108, and the signal is again driven by the same drive device circuit in I/O pad 114 on chip 102, resulting in a large impedance presented to the signal on its way to reach chip 108. It should also be noted that I/O pads 120 and 124 on chip 104, I/O pads 128 and 132 on chip 106, and I/O pad 136 on chip 108 do not have any wire bond connections in shown, as is the case for the unused I/O pads 112 and 116 on chip 102.

Each of the I/O pads 110, 112, 114 and 116 may have an attached output transistor to provide sufficient electrical power to overcome the impedance of the interconnection wiring. Impedance is a measure of the delay that charging up an electrical wire causes in the transmission of a signal, and is a combination of the resistance, capacitance and inductance of the interconnect, such as the wire bonds 140, 142 and 144 shown. In order to obtain sufficient signal transmission speed the output transistor may require a large size and use a large portion of the chip area.

Figure 2:
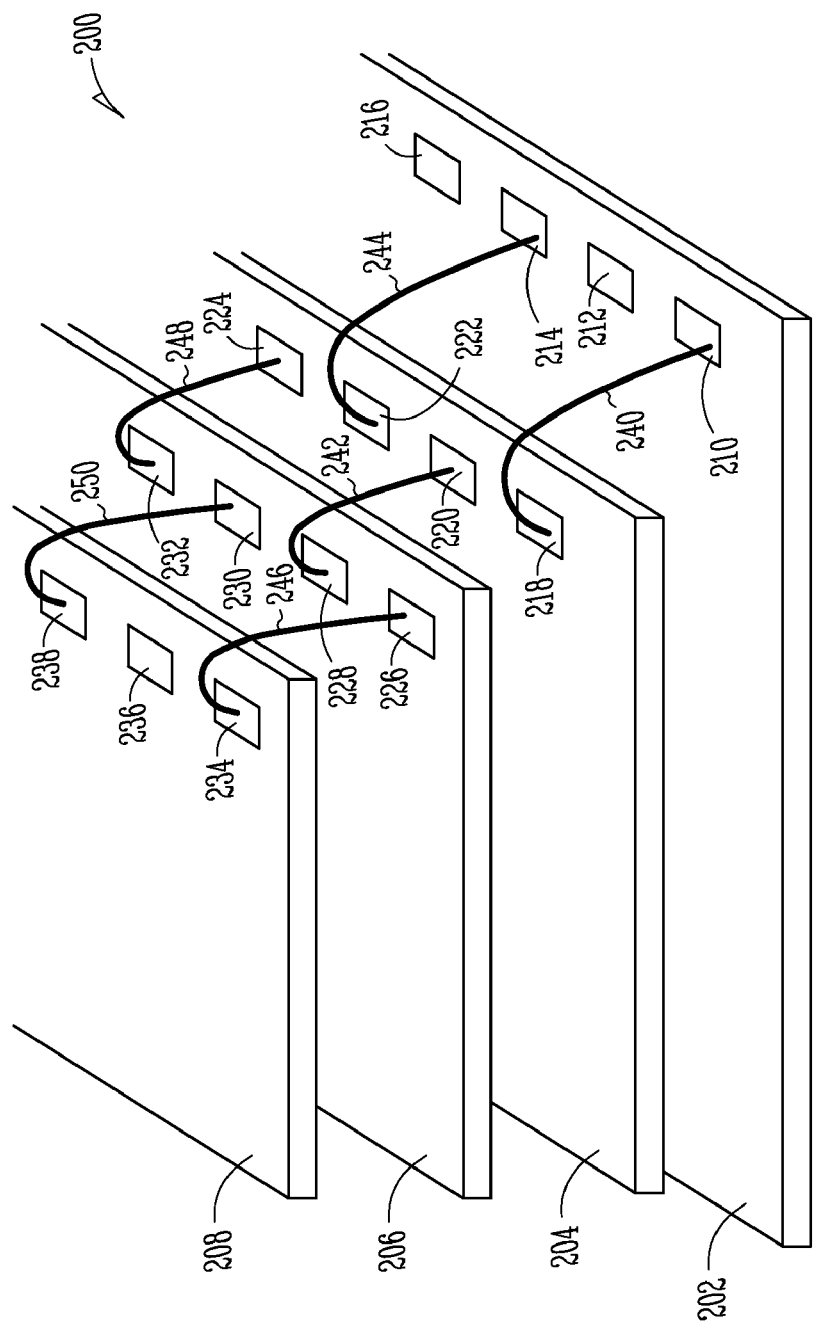
FIG. 2 illustrates a stack of IC chips connected in accordance with an illustrative embodiment.

FIG. 2 illustrates a stack 200 of IC chips connected according to an illustrative embodiment. Multiple interconnected IC devices, such as memory devices and logic devices, are shown in a stacked arrangement. The stack 200 includes IC chips 202, 204, 206 and 208. Chip 202 may comprise a logic chip or a microprocessor closely connected to memory chips 204, 206 and 208, but the present subject matter is not so limited, and may include any number of chips and any combination of chip types. As previously discussed, embodiments may use a base logic chip, such as chip 202, as the driver for signals transferred to memory chips 204, 206 and 208. Thus the drive device connected to an I/O pad on chip 202, such as pads 210, 212, 214 and 216, should be capable of driving a strong enough signal to rapidly overcome the impedance of inter-chip electrical connections, such as wire bond 240 to I/O pad 218 on chip 204, as well as the additional wire bonds and connections shown in FIG. 1. The present subject matter includes limiting the number of I/O pads on other chips in direct communications with I/O pad 210 of chip 202. FIG. 2 shows that I/O pad 210 on chip 202 is electrically connected to I/O pad 218 on chip 204, thus limiting the total electrical impedance by limiting the number of other I/O pads in direct contact.

High density modules were previously formed by vertically stacking integrated circuit (IC) die (chips) one above another. Each IC in the stack may have a number of input output (I/O) locations (or pads), some of which may not be used in a particular IC design. Each I/O pad on each IC die might be connected (for example by wirebonding) to the I/O pad immediately below and the I/O pad immediately above, resulting in relatively long signal propagation times. This situation may be aggravated by long wire lengths from the drive device on the sending chip, which can be located in a substrate or on a controlling chip at the bottom of the vertical stack of ICs. The long wire length and the capacitive loading of the circuitry attached to each I/O pad may thus result in increased impedance and increased signal propagation delay. The method of connecting chips in a stack shown in FIG. 2 provides lower impedance (i.e., at least one of low capacitance and low inductance) inter-chip connections by routing inter-chip signals intended to travel to more than a single IC through drive circuits at the unused I/O locations. The drive circuit may also be beneficially located in a chip located in the middle of the stack, for example on chip 206 rather than on chip 202, to reduce the total length of the worst case wire length, and therefore the time required for the signal to travel between the chips.

As previously discussed with regard to current methods of interconnecting stacked IC chips, not every single I/O pad on a chip is likely to be used in every design, and thus a number of I/O pads, such as 112 and 116 on chip 102 of FIG. 1, and 120 and 124 on chip 104 of FIG. 1 are not in use in the particular electrical design shown. The present arrangement can make use of these unused I/O pads as shown by the wire bond 242 going from I/O pad 220 on chip 204 to I/O pad 228 on chip 206. The drive device associated with I/O pad 210 of chip 202 provides the power for the signal from I/O pad 210 on chip 202 via wirebond 240 to I/O pad 218 on chip 204. Control circuitry associated with I/O pad 218 may then direct the signal to previously unused I/O pad 220 (which is shown as being directly next to the I/O pad 218 but the present subject matter is not so limited and the previously unused I/O pad may be located anywhere on the chip 204), which may then use its associated drive device to transmit the signal from I/O pad 220 via wirebond 242 to the previously unused I/O pad 228 on chip 206. Control circuitry associated with I/O pad 228 may then direct the signal to I/O pad 226, which may use it's associated drive device to transmit the signal via wire bond 246 to I/O pad 234 on chip 208. In this fashion the same signal may be passed to each and every chip in a stack 200 without using a single I/O pad device driver to provide all of the power needed to transmit the signal to all the other chips. This reduces the overall impedance that a signal may experience by utilizing existing and otherwise unused device drivers and I/O pads to increase the data transmission rate. The additional control circuitry used to direct the above noted signal, if not already available in the standard chip design, may increase the size of a chip from about 0.5% to about 1.0%, depending upon the level of integration of the chips 202, 204, 206 and 208.

Some embodiments make use of the unused I/O pads, and their associated device drivers and control circuitry to buffer communications to the outside world, including other chips located in a stacked arrangement and closely coupled to a primary chip, and the printed circuit board (PCB) upon which the primary chip may be connected. The signal delay can thus be reduced by using previously unused I/O pads, the associated control circuitry and device drivers to reduce the number of other I/O pads and external circuits to which each I/O pad is directly connected. It should be noted that while the described arrangement of FIG. 2 shows no more than one electrical connection (such as wire bonds 240, 242, 244, 246, 248 and 250) from each I/O pad (such as 210, 214, 218, 220, 222, 224, 226, 228, 230 232, 234 and 238) as compared to the multiple wire bonds shown in FIG. 1, the present subject matter is not so limited. The FIG. 2 arrangement may be considered as a best case situation when there are sufficient numbers of previously unused I/O pads to have a one-to-one correspondence between unused I/O pad drivers and I/O pads that can benefit from being coupled to them. A goal is to use the unused I/O pads and drivers to obtain the shown situation of a single connection from each I/O pad.

In the case where an I/O pad and it's associated device driver only drives a single communications signal such as a wire bond, the impedance environment would appear to be approximately the same as in a monolithic device, and the resulting signal delays will be minimized as compared to a stack of ICs being driven by a single device driver and I/O pad. The present subject matter may include an approximately 1% increase in chip area related to adding control circuitry to control the routing of the signals to the previously unused I/O pads.

Figure 3:
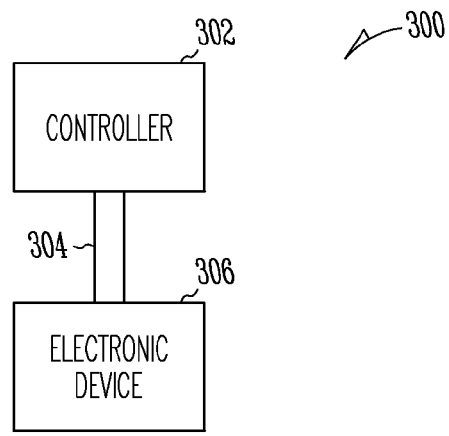
FIG. 3 is a block diagram of an electronic device in accordance with an embodiment of the invention.

FIG. 3 is a block diagram of an electronic device 306 in accordance with an embodiment of the invention. Electronic system 300 includes a controller 302, a bus 304, and an electronic device 306, where bus 304 provides electrical conductivity between controller 302 and electronic device 306. In various embodiments, controller 302 and/or electronic device 306 include an embodiment for a portion of the device 306 having logic and memory chips stacked and interconnected as previously discussed herein. Thus, the device 306 may include one or more chip stacks that are similar to or identical to the stack 200 shown in FIG. 2. Electronic system 300 may include, but is not limited to, information handling devices, wireless systems, telecommunication systems, fiber optic systems, electro-optic systems, and computers.

Figure 4:
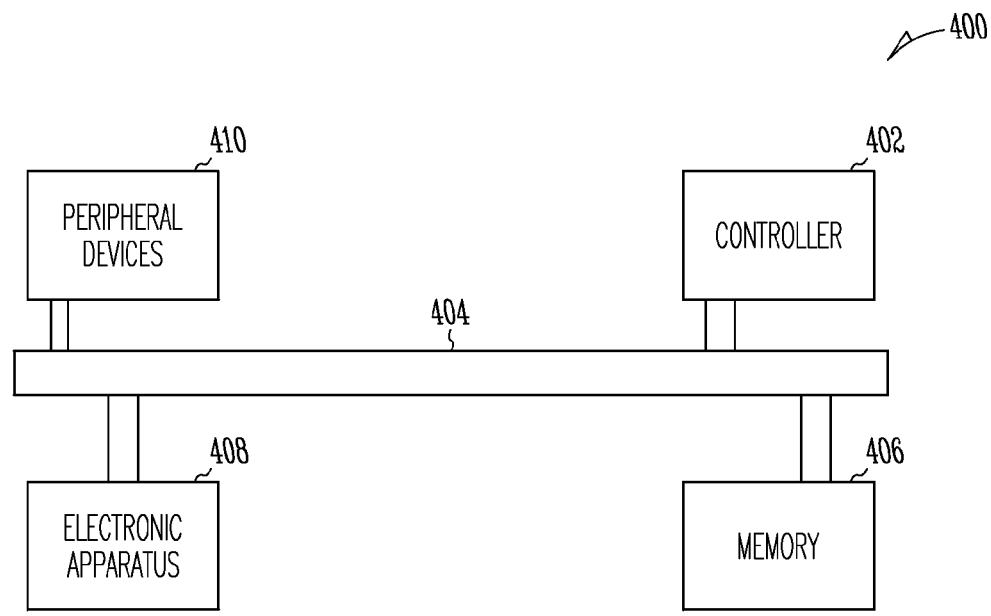
FIG. 4 is a diagram of an electronic system having devices in accordance with an embodiment of the invention.

FIG. 4 is a diagram of an electronic system 400 having devices in accordance with an embodiment of the invention. The system 400 includes a controller 402 and a memory 406. Controller 402 and/or memory 406 may each include a potion of the circuit having IC devices and memory chips stacked and connected in accordance with the disclosed embodiments. Thus, the controller 402 and memory 406 may include one or more chip stacks that are similar to or identical to the stack 200 shown in FIG. 2.

System 400 also includes an electronic apparatus 408, and a bus 404, where bus 404 may provide electrical conductivity and data transmission between controller 402 and electronic apparatus 408, and between controller 402 and memory 406. Bus 404 may include an address bus, a data bus, and a control bus, each independently configured. Bus 404 also uses common conductive lines for providing address, data, and/or control, the use of which may be regulated by controller 402. In an embodiment, electronic apparatus 408 includes additional memory devices configured similarly to or identically to memory 406. An embodiment includes an additional peripheral device or devices 410 coupled to bus 404. In an embodiment controller 402 is a processor. Any of bus 404, electronic apparatus 408, and peripheral device or devices 410 may include ICs being stacked in accordance with the disclosed embodiments. Thus, the bus 404, the electronic apparatus 408, and the peripheral device 410 may include one or more chip stacks that are similar to or identical to the stack 200 shown in FIG. 2.

System 400 may include, but is not limited to, information handling devices, telecommunication systems, and computers. Peripheral devices 410 may include displays, additional memory, or other control devices operating with controller 402 and/or memory 406.

Figure 5:
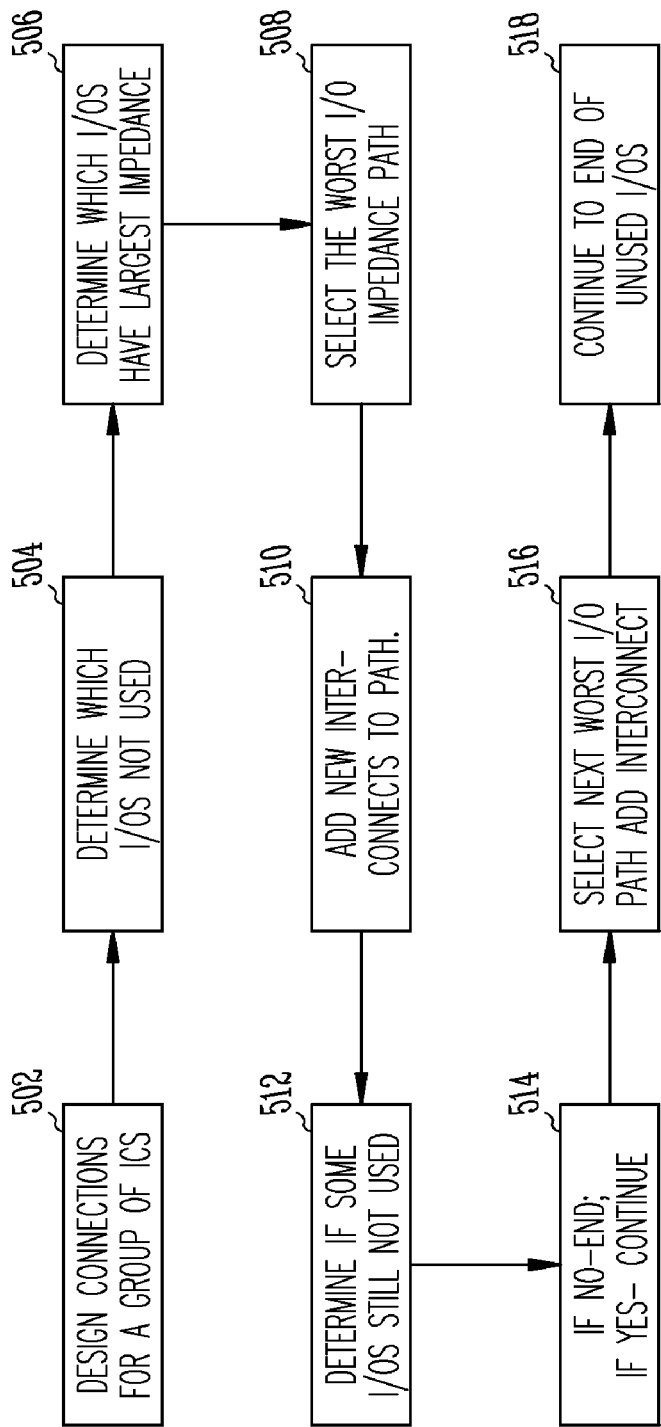
FIG. 5 is a flowchart of a method to reduce impedance between connected integrated circuit devices in accordance with an embodiment of the invention.

FIG. 5 is a flowchart of a method to reduce impedance between connected integrated circuit devices in accordance with an embodiment of the invention. The reduction of impedance presented to signals propagating within a chip stack may be obtained in various combinations of the described embodiments, including a method of electrically connecting a plurality of integrated circuit devices 502, by first determining which electrical connections (preferably the input/output or I/O pads) on each integrated circuit device are not used in the circuit design 504, and which electrical connections or I/O pads are used. Then determining which electrical paths connecting the ICs or chips in the stack have the largest electrical impedance value 506 and interconnecting the chips by routing portions of the highest impedance path 508 through some of the unused electrical connections 510 to spread the electrical load. Repeating this process 512 if there are still unused I/Os pads 514 to the next I/O path 516 until there are no longer any unused I/O pads 518. In the best case there may be enough unused I/O pads to be able to arrange routing so that only a single electrical pad driver connects from each electrical interconnection in a particular electrical signal path. In some embodiments, the routing for the largest electrical impedance value path may be arranged to have a single electric connection between each I/O pad along the signal path. In the case where the chips already have sufficient control circuitry associated with the electrical connection pads to route the electrical path to one of the unused electrical connections, there will be no area penalty to rerouting signals through the unused I/O pads. In some cases, however, the extra control circuitry may add about 0.5 to 1.0% to the circuitry area used on the chip.

In another method of interconnecting ICs to reduce the signal impedance in ICs attached in a vertical stack, the I/O pads of one IC connected (at least electrically) to another IC by connecting each I/O pad to only one other IC in the vertical stack. The I/O pads may include a connection to an unused connection of another one of the ICs in the vertical stack, and the electrical connection may include wire bonds which may be on at least one edge of the ICs. A stack of ICs may have the IC with the largest area the lowest in the vertical stack, with a second largest area one of the plurality of ICs the next higher IC in the vertical stack, and a third largest area IC being the third IC in the vertical stack, and located above the second largest area IC. In the case where the ICs are not all in descending size order it may be beneficial to form vertical bumps attached either between two facing top surfaces of the ICs in the vertical stack, or connecting a top surface of a lower IC to input/output pads on a bottom surface of an upper IC. The top to bottom attachment may benefit from (and include) the use of through silicon vias that go from the top surface to the bottom surface of the IC.

Another method of electrically connecting a plurality of IC devices includes determining a plurality of unused electrical connections on each IC. Then determining a first set of electrical paths between the ICs that have higher electrical impedance value than other electrical paths, and could benefit from reduced impedance. Adding additional interconnections for the first set of paths by adding some of the unused electrical connections into the first set of paths to reduce the impedance.

A circuit having the described arrangement of low impedance interconnections includes ICs attached in a vertical stack where each individual IC includes both electrical connections used in a selected circuit design and electrical connections not used in the circuit design. The electrical path connecting the ICs includes at least one of the otherwise unused electrical connections on at least one IC to spread the electrical load and utilize otherwise unused I/O pads and their associated drive circuitry. The interconnection may be more easily constructed if each one of the ICs in the vertical stack has a different physical dimension and can be stacked in decreasing size order with the largest physical dimension located at the bottom and the smallest physical dimension located at the top of the vertical stack.

Each of the ICs in the vertical stack includes a plurality of signal output pads on the edge for electrical connections, and the signal output pads may be on all four sides of the IC. The interconnection are arranged to reduce impedance by setting each of the signal output pads to be connected to only one of the other ICs in the vertical stack. Control circuitry on the signal output pads of a first IC may be used to route an incoming signal to an unused signal output pad for transmission to a second IC, and so utilize the unused portions of the first IC.

The signal output pads may be connected to selected other signal output pads on other ICs by wire bonds, flexible tape, solder bumps, or gold bumps, depending upon the relative sizes of the various ICs and the technology, and it may be beneficial to limit each electrical connection to a single connection to another IC.

A system having the described arrangement of low impedance interconnections may include a controller connected to an electronic device having a plurality of ICs coupled to the controller. Each of the ICs may have electrical connections to the other integrated circuits. Each IC may have I/O pads and drive circuits used in a selected circuit design, and I/O pads and drive circuits not used in the selected circuit design. Additional inter IC connections using the I/O pads that are unused and added to the electrical path may reduce the overall impedance. In this fashion the electrical path connects each one of the plurality of integrated circuits to each other one of the plurality of integrated circuits with a single electrical path similar to the situation found in monolithic device.

Although specific embodiments have been illustrated and described herein, it will be appreciated by those of ordinary skill in the art that any arrangement that is calculated to achieve the same purpose may be substituted for the specific embodiments shown. This application is intended to cover any adaptations or variations of embodiments of the present invention. It is to be understood that the above description is intended to be illustrative, and not restrictive, and that the phraseology or terminology employed herein is for the purpose of description and not of limitation. Combinations of the above embodiments and other embodiments will be apparent to those of skill in the art upon studying the above description. The present invention includes any other applications in which embodiments of the above arrangements are used.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a few embodiments for the purpose of streamlining the disclosure. This method of disclosure is not to be interpreted to require more features than are expressly recited in each claim. Rather, inventive subject matter may be found in less than all features of a single disclosed embodiment. Thus the following claims are hereby incorporated into the Detailed Description, with each claim standing on its own as a separate embodiment. The scope of the embodiments of the present invention should be determined with reference to the appended claims, along with the full scope of equivalents to which such claims are entitled.

What is claimed is:

1. An electronic apparatus comprising:
    a plurality of integrated circuit chips attached in a vertical stack;
    a plurality of input/output pads on each integrated circuit chip of the plurality of integrated circuit chips; and
    a plurality of electrical connections arranged such that each of the input/output pads on each integrated circuit chip is connected to at most only one other one of the plurality of integrated circuit chips in the vertical stack by only one of the electrical connections.

2. The electronic apparatus of claim 1, wherein the electrical connections include one or more of wire bonds, gold bumps, solder bumps, beam leads, or through silicon vias.

3. The electronic apparatus of claim 1, wherein the plurality of integrated circuit chips includes integrated circuits of different sizes stacked from a bottom to a top of the vertical stack in a decreasing size order with an integrated circuit chip having a largest physical area located at the bottom of the vertical stack and an integrated circuit chip having a smallest physical area located at the top of the vertical stack.

4. The electronic apparatus of claim 3, wherein each integrated circuit chip of the plurality of integrated circuit chips has an area different from an area of anyone of the other ones of the integrated circuit chips.

5. The electronic apparatus of claim 1, wherein each integrated circuit chip includes a plurality of signal drivers associated with the plurality of input/output pads on said each integrated circuit chip, wherein a number of the plurality of signal drivers equals to a number of the plurality of input/output pads for each integrated circuit chip.

6. The electronic apparatus of claim 1, wherein one of the integrated circuit chips in the vertical stack is structured to direct signals among the integrated circuit chips in the vertical stack.

7. The electronic apparatus of claim 6, wherein the one integrated circuit chip in the vertical stack structured to direct signals among the integrated circuit chips in the vertical stack is located in a middle location in the vertical stack.

8. The electronic apparatus of claim 6, wherein the one integrated circuit chip in the vertical stack structured to direct signals among the integrated circuit chips in the vertical stack is located at a bottom location in the vertical stack.

9. The electronic apparatus of claim 1, wherein the electrical connections are arranged among the integrated circuit chips such that a total electrical impedance associated with the electrical connections is minimized relative to possible arrangements of the electrical connections.

10. An electronic apparatus comprising:
    a plurality of memory chips attached in a vertical stack;
    a plurality of input/output pads on each memory chip of the plurality of memory chips; and
    a plurality of electrical connections arranged such that each of the input/output pads on each memory chip is connected to at most only one other one of the plurality of memory chips in the vertical stack by only one of the electrical connections.

11. The electronic apparatus of claim 10, wherein the vertical stack includes a logic chip to direct transfer of signals to the memory chips.

12. The electronic apparatus of claim 11, wherein the logic chip is located at a bottom of the vertical stack, the logic chip having a plurality of input/output pads and a plurality of electrical connections arranged such that each of the input/output pads on the logic chip is connected to at most one other one of the memory chips in the vertical stack by only one of the electrical connections from the logic chip.

13. The electronic apparatus of claim 11, wherein the logic chip has a physical area larger than a physical area of each memory chip in the vertical stack.

14. The electronic apparatus of claim 10, wherein the vertical stack includes a microprocessor chip to direct transfer of signals to the memory chips.

15. The electronic apparatus of claim 10, wherein the vertical stack has a bottom and a top such that the memory chips are stacked according to a decreasing size order of a physical area of the memory chips.

16. The electronic apparatus of claim 10, wherein the electronic apparatus includes a controller coupled to the vertical stack by a bus.

17. A method comprising:
arranging a plurality of integrated circuit chips in a vertical stack such that the integrated circuit chips are located according to an order, the order correlated to a physical dimension of the integrated circuit chips; and
connecting a plurality of input/output pads on each integrated circuit chip to other ones of the plurality of integrated circuit chips such that each of the input/output pads on each integrated circuit chip is connected to at most only one other one of the plurality of integrated circuit chips in the vertical stack by only one electrical connection of a plurality of electrical connections.

18. The method of claim 17, wherein the arranging the plurality of integrated circuit chips includes arranging the plurality of integrated circuit chips according to an order in decreasing physical area of the plurality of integrated circuit chips.

19. The method of claim 17, wherein the arranging the plurality of integrated circuit chips includes arranging, in the vertical stack, an integrated circuit chip structured to direct signals among the plurality of integrated circuit chips.

20. The method of claim 17, wherein the arranging the plurality of integrated circuit chips includes arranging a plurality of memory chips stacked on a logic chip or a microprocessor chip, the logic chip or microprocessor chip arranged to transfer signals to the memory chips.

21. The method of claim 17, wherein the arranging the plurality of integrated circuit chips includes arranging the plurality of electrical connections among the integrated circuit chips such that a total electrical impedance associated with the electrical connections is minimized relative to possible arrangements of the electrical connections among the integrated circuit chips.

* * * * *